(12) United States Patent
Xue et al.

(10) Patent No.: US 11,798,888 B2
(45) Date of Patent: Oct. 24, 2023

(54) CHIP PACKAGING STRUCTURE AND METHOD FOR PREPARING SAME

(71) Applicant: SJ Semiconductor (Jiangyin) Corporation, Jiangyin (CN)

(72) Inventors: Yayuan Xue, Jiangyin (CN); Xingtao Xue, Jiangyin (CN); Chengchung Lin, Jiangyin (CN)

(73) Assignee: SJ SEMICONDUCTOR (JIANGYIN) CORPORATION, Jiangyin (CN)

( * ) Notice: Subject to any disclaimer, the term of this patent is extended or adjusted under 35 U.S.C. 154(b) by 53 days.

(21) Appl. No.: 17/548,145

(22) Filed: Dec. 10, 2021

(65) Prior Publication Data
US 2022/0189878 A1    Jun. 16, 2022

(30) Foreign Application Priority Data

Dec. 11, 2020 (CN) .......................... 202011458682.2
Dec. 11, 2020 (CN) .......................... 202022971251.8

(51) Int. Cl.
*H01L 23/538* (2006.01)
*H01L 23/00* (2006.01)

(52) U.S. Cl.
CPC .......... *H01L 23/5384* (2013.01); *H01L 24/14* (2013.01); *H01L 24/94* (2013.01)

(58) Field of Classification Search
CPC ...... H01L 23/5384; H01L 24/14; H01L 24/94
See application file for complete search history.

(56) References Cited

U.S. PATENT DOCUMENTS

| | | | |
|---|---|---|---|
| 2012/0001337 A1* | 1/2012 | Tsai | H01L 23/544 257/E23.161 |
| 2015/0024574 A1* | 1/2015 | Kim | C09J 183/06 525/477 |
| 2021/0327723 A1* | 10/2021 | Lu | H01L 23/147 |

* cited by examiner

*Primary Examiner* — Trang Q Tran
(74) *Attorney, Agent, or Firm* — Alston & Bird LLP

(57) ABSTRACT

A chip packaging structure and a method for preparing the same are disclosed. The method includes: providing a wafer having a first surface and a second surface, forming a first redistribution layer on the first surface, wherein the wafer includes TSVs having first ends exposed from the wafer; forming welding pads electrically connected to the TSVs through the first redistribution layer; forming a trimming groove in an edge area of the wafer; bonding the first surface of the wafer to a first supporting substrate, and thinning the second surface of the wafer to expose the second ends of the TSVs; forming, on the second surface of the wafer, solder balls electrically connected to the TSVs through a second redistribution layer; bonding the second surface of the wafer to a second supporting substrate, and peeling off the first supporting substrate; and connecting the welding pads to a semiconductor chip.

7 Claims, 5 Drawing Sheets

CHIP PACKAGING STRUCTURE AND METHOD FOR PREPARING SAME

CROSS REFERENCE TO RELATED APPLICATION

The present application claims the benefit of priority to Chinese Patent Application No. CN 2020114586822, entitled "CHIP PACKAGING STRUCTURE AND METHOD FOR PREPARING SAME", and Chinese Patent Application No. CN 2020229712518, entitled "CHIP PACKAGING STRUCTURE", both filed with CNIPA on Dec. 11, 2020, the disclosures of which are incorporated herein by reference in their entirety for all purposes.

FIELD OF TECHNOLOGY

The present disclosure generally relates to semiconductor packaging technology, in particular, to a chip packaging structure and a method for preparing the same.

BACKGROUND

Wafer-level packaging structures of chips have better integration level and flexibility, can be adopted to standardized package sizes and various high-density chip packaging, thus are widely used in advanced technology fields such as antenna chips.

At present, in a wafer-level packaging structure, it is required to thin wafers that have Through-Silicon vias (TSV), and then to dispose solder bumps and chips on different surface of the structure to obtain a high-density chip packaging structure.

However, the thinned wafers generally have serious warpage problems and are prone to breakage under stress, leading to scrapping the wafers. If the thickness of the thinned wafer is increased in order to ensure a higher mechanical strength, it will be difficult to reduce the size of the packaging structure and the complexity of the subsequent TSV processes. In addition, the electrothermal performance and communication performance of the chip packaging structure are also problematic.

Therefore, it is necessary to provide a new chip packaging structure and a method for preparing the same to solve the above problems.

SUMMARY

An embodiment of the present disclosure provides a method for preparing a chip packaging structure. The method comprises the following steps:
providing a wafer having a first surface and a second surface opposite to each other, wherein through-silicone vias (TSVs) are formed in the wafer, and wherein each of the TSVs has a first end exposed from a first surface of the wafer;
forming, on the first surface of the wafer, welding pads electrically connected to the TSVs;
forming a trimming groove on the first surface of the wafer, wherein the trimming groove is located in an edge area of the wafer;
bonding the first surface of the wafer to a first supporting substrate, and thinning the second surface of the wafer to expose second ends of the TSVs;
forming, on the second surface of the wafer, solder balls electrically connected to the TSVs;
bonding the second surface of the wafer to a second supporting substrate, and peeling off the first supporting substrate; and
connecting chips to the welding pads.

In an example of the present disclosure, a first redistribution layer is further formed between the TSVs and the welding pads and electrically connects the TSVs to the welding pads, and a second redistribution layer is further formed between the TSVs and the solder balls and electrically connects the TSVs to the welding pads.

In an example of the present disclosure, an under bump metallization (UBM) layer is further formed between the second redistribution layer and the solder balls.

In an example of the present disclosure, a depth of the trimming groove is greater than a thickness of the thinned wafer.

In an example of the present disclosure, the welding pads are connected to the chip by a flip-chip bonding technique.

In an example of the present disclosure, after the welding pads is connected to the chip, the method further comprises a step of forming a packaging layer on the first surface of the wafer and peeling off the second supporting substrate.

In an example of the present disclosure, the first supporting substrate and the second supporting substrate are bonded to the wafer by a first bonding layer and a second bonding layer respectively, and wherein peeling off the first supporting substrate and the second supporting substrate comprises removing the bonding layer by using a chemical solvent.

Another embodiment of the present disclosure provides a chip packaging structure. The chip packaging structure comprises:
a wafer, having a first surface and a second surface opposite to each other;
TSVs, formed in the wafer, wherein each of the TSVs has a first end exposed from the first surface of the wafer and a second end exposed from the second surface of the wafer;
welding pads, formed on the first surface of the wafer and electrically connected to the TSVs; and
a trimming groove, formed in the first surface of the wafer and located in an edge area of the wafer.

In an example of the present disclosure, a first redistribution layer is further formed between the TSVs and the welding pads.

In an example of the present disclosure, a depth of the trimming groove is greater than a thickness of the thinned wafer.

The present disclosure further provides a chip packaging structure. The chip packaging structure comprises:
a wafer, having a first surface and a second surface opposite to each other;
TSVs, formed in the wafer, wherein both ends of the TSVs are exposed respectively from the first and second surfaces of the wafer;
welding pads, formed on the first surface of the wafer and connected to the TSVs; and
solder balls, formed on the second surface of the wafer and connected to the TSVs.

In an example of the present disclosure, a first redistribution layer is further formed between the TSVs and the welding pads, and electrically connects the TSVs to the welding pads, and wherein a second redistribution layer is further formed between the TSVs and the solder balls, and electrically connects the TSVs to the solder balls.

In an example of the present disclosure, the chip packaging structure further comprises semiconductor chips, and the semiconductor chips are connected to the welding pads.

In the chip packaging structure and method for preparing the same provided in the present disclosure, a trimming groove is introduced in a to-be-thinned wafer, reducing stress generated by a thinning process and the risk of wafer fractures; temporarily bonded first supporting substrate and second supporting substrate are introduced in the processes such as thinning, thereby preventing abnormal warpage of the wafer after the thinning, and enhancing reliability of the processes; and a multi-layer chip structure further effectively reduces the packaging size, and enhances the electrothermal performance and the communication performance of the packaging structure.

DETAILED DESCRIPTION

Figure 1:
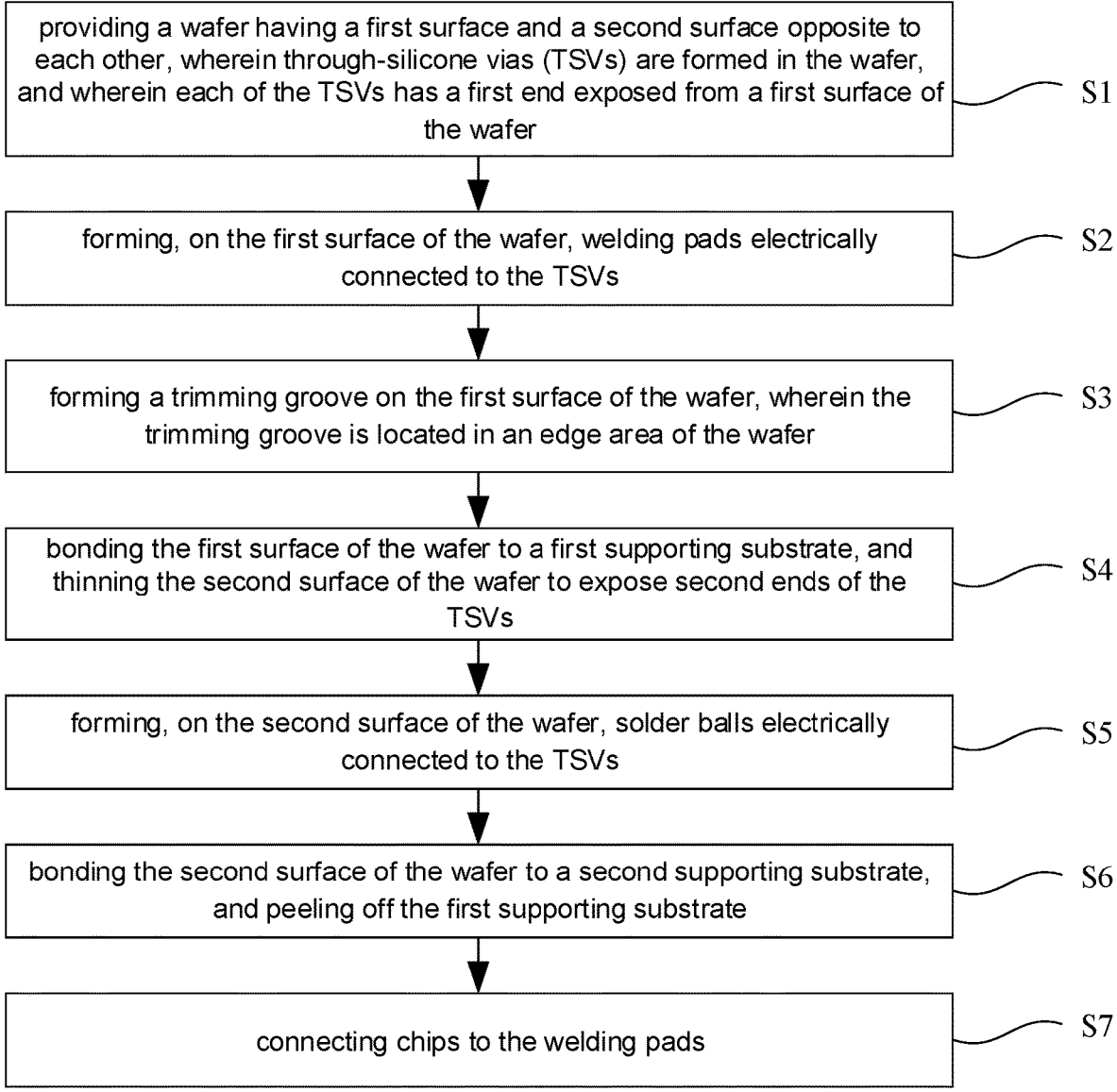
FIG. 1 is a flowchart of a method for preparing a chip packaging structure according to Embodiment I of the present disclosure.

Implementations of the present disclosure are described as follows through specific embodiments, and a person skilled in the art may easily understand other advantages and effects of the present disclosure from the content disclosed in this specification. The present disclosure may also be implemented or applied through another different specific implementation, and any modification or variation may be made to each detail in this specification based on different opinions and applications without departing from the spirit of the present disclosure.

Referring to FIG. 1 to FIG. 13. It is to be noted that the drawings provided in these embodiments only illustrate the basic ideas of the present disclosure in a schematic manner. The drawings only show components related to the present disclosure, instead of drawing according to the numbers, shapes, and sizes of the components in actual implementation. In actual implementation, the type, quantity, and ratio of each component may be changed as needed, and the layout of the components may also be more complex.

Embodiment I

Referring to FIG. 1 to FIG. 13, the embodiment 1 of the present disclosure provides a method for preparing a chip packaging structure. The method comprises the following steps:

1): Provide a wafer 101 having a first surface and a second surface disposed opposite to each other, a redistribution layer 109 is formed on the first surface of the wafer 101, TSVs 102 are formed in the wafer 101, and each of the TSVs 102 has a first end exposed from the first surface of the wafer.

2): Form welding pads 103 on the redistribution layer 109, each pad is aligned to one of the TSVs 102 and is electrically connected to the TSVs 102 through the redistribution layer 109.

3): Form a trimming groove 104 on the edge area of first surface of the wafer 101.

Figure 6:
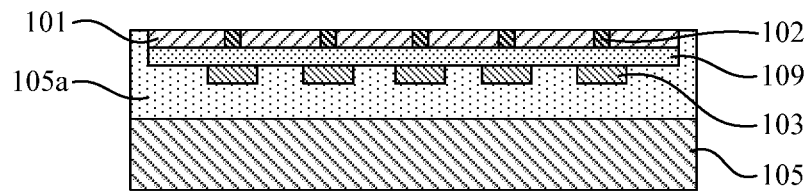
FIG. 6 is a schematic cross-sectional view of Embodiment I of the present disclosure after a second surface of the wafer is thinned.

4): Bond the first surface of the wafer 101 to a first supporting substrate 105 with the help of a bonding layer 105a, and thin the second surface of the wafer 101 to expose the second ends of TSVs 102 (FIG. 6).

5): Form second redistribution layer 110 on the second surface of the wafer 101, form UBM layers on the second redistribution layer 110 to connect to the TSVs 102, and form solder balls 106 each on one of the UBM layers.

6): Bond the second redistribution layer 110 to a second supporting substrate 107 by using a second bonding layer 107a, and peel off the first supporting substrate 105 including the bonding layer 105a.

7): Connect chips 108 to the welding pads 103 in a process including, depositing chip metal layers 108a on the chip surfaces, forming chip solder balls 108b on the chip metal layers 108a, attaching chip solder balls to the welding pads 103 and filling under chip fill layers 108c between chips and the corresponding pad s103.

Figure 2:
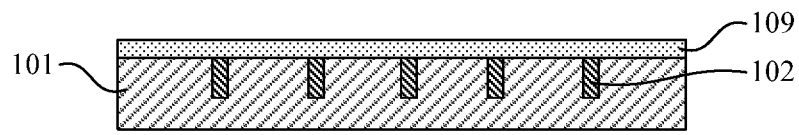
FIG. 2 is a schematic cross-sectional view of a wafer according to Embodiment I of the present disclosure.

In step 1), referring to S1 in FIG. 1 and FIG. 2, the wafer 101 is first provided, and the TSVs 102 are formed in the wafer 101. In FIG. 1, the first surface is located on an upper side of the wafer 101, and the second surface is located on a lower side of the wafer 101.

As an example, the wafer 101 comprises a silicon substrate. A method for forming the TSVs 102 comprises: forming a deep trench in the first surface of the wafer 101 by deep silicon dry etching, and filling the deep trench with a conductive material, such as copper or tungsten, to form the TSVs 102. It is to be noted that, at this time, the wafer 101 has not been thinned. Therefore, a second end of each of the TSVs 102 only is embedded inside the wafer 101 and will be exposed from the second surface of the wafer 101 by a subsequent thinning process.

Figure 3:
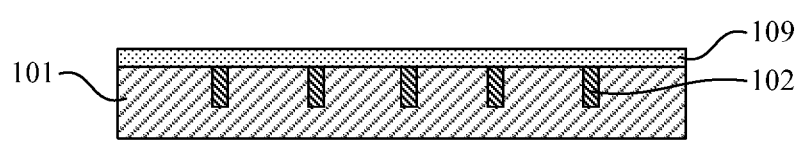
FIG. 3 is a schematic cross-sectional view of Embodiment I of the present disclosure after welding pads connected to through-silicon vias (TSVs) is formed on a first surface of the wafer.

In step 2), referring to S2 in FIG. 1 and FIG. 3, the welding pads 103 connected to the TSVs 102 are formed on the first surface of the wafer 101.

As an example, the welding pads 103 comprises one or more material layers made of one or more of copper, aluminum, nickel, gold, silver, and titanium. A method for forming the welding pads 103 comprises chemical vapor deposition and physical vapor deposition. After deposition, the welding pads 103 are patterned by lithography and etching. In addition to the foregoing material layers made of metals, the welding pads 103 may further comprise an adhesion layer, such as a titanium nitride layer.

As an example, a first redistribution layer 109 is further formed between the TSVs 102 and the welding pads 103. Optionally, the first redistribution layer 109 comprises at least one metal distribution layer and a dielectric layer wrapped around the metal distribution layer. Optionally, a material of the metal distribution layer comprises one or more of copper, aluminum, nickel, gold, silver, and titanium. A material of the dielectric layer comprises one or more of epoxy resin, silica gel, polyimide, piperonyl butoxide (PBO), benzocylobutene (BCB), silicon dioxide, phosphosilicate glass, and fluorine-containing glass. A process for depositing the metal distribution layer comprises a chemical vapor deposition process, an evaporation process, a sputtering process, an electroplating process, or a chemical plating process. After deposition, the metal distribution layer is patterned by lithography and etching. A process for forming the dielectric layer comprises a chemical vapor deposition process or a physical vapor deposition process. By repeatedly forming metal distribution layers and dielectric layers, a first redistribution layer 109 having a multi-layer structure can be obtained.

Figure 4:
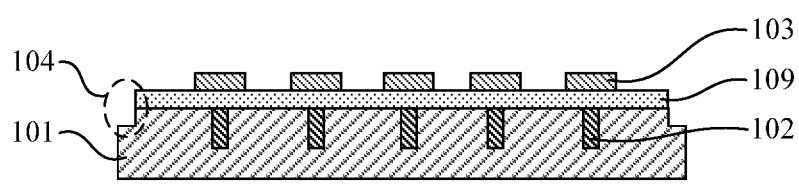
FIG. 4 is a schematic cross-sectional view of Embodiment I of the present disclosure after a trimming groove is formed on a first surface of the wafer.

In step 3), referring to S3 in FIG. 1 and FIG. 4, the trimming groove 104 is formed in the first surface of the wafer 101, wherein the trimming groove 104 is located in an edge area of the wafer 101.

As an example, the trimming groove 104 may be formed by mechanical cutting and grinding, laser etching, dry etching, or the like. The trimming groove 104 may be on an outer peripheral edge of the wafer 101. The depth of the trimming groove 104 is greater than the thickness of the thinned wafer 101. By introducing the trimming groove 104, stress distribution on the wafer 101 during thinning can be more uniform. In this way, the wafer 101 is less likely to crack due to stress.

Figure 5:
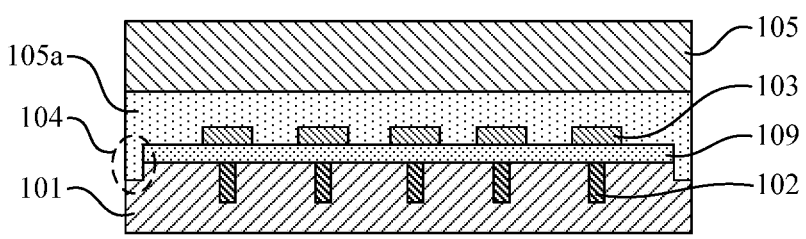
FIG. 5 is a schematic cross-sectional view of Embodiment I of the present disclosure after a first supporting substrate is boned to the wafer by means of a first bonding layer.

In step 4), referring to S4 in FIG. 1 and FIG. 5 to FIG. 6, the first surface of the wafer 101 is bonded to the first supporting substrate 105, and the second surface of the wafer 101 is thinned to expose the TSVs 102.

As an example, as shown in FIG. 5, the first supporting substrate 105 is bonded to the wafer 101 by means of a first bonding layer 105a. The first bonding layer 105a may be an organic bonding agent having a degree of viscosity. By bonding the first surface of the wafer 101 to the first supporting substrate 105, the wafer 101 can be prevented from being warped during the subsequent grinding and thinning processes, thereby protecting the wafer 101 from abnormalities such as cracking.

As an example, as shown in FIG. 6, the structure in FIG. 5 is flipped in such a way that the second surface of the first supporting substrate 105 faces upward. The second surface of the wafer 101 is thinned to expose the TSVs 102. It may be learned from FIG. 6 that, the thinning process stops when reaching the trimming groove 104 on the edge of the wafer 101, so that the area covered by the thinned wafer 101 is smaller than that of the first supporting substrate 105 that is now below the wafer 101.

Figure 7:
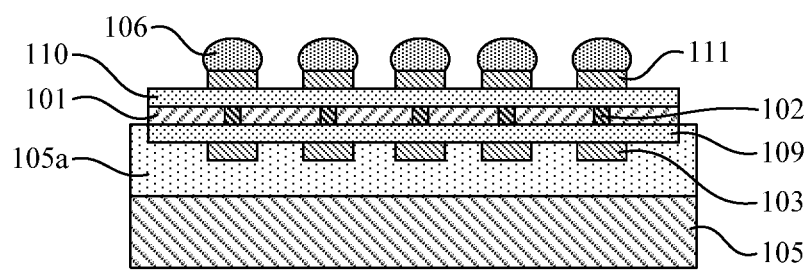
FIG. 7 is a schematic cross-sectional view of Embodiment I of the present disclosure, after solder balls connected to silicon vias are formed on a second surface of the wafer.

In step 5), referring to S5 in FIG. 1 and FIG. 7, the solder balls 106 connected to the TSVs 102 are formed on the second surface of the wafer 101.

As an example, as shown in FIG. 7, a second redistribution layer 110 is further formed between the TSVs 102 and the solder balls 106. An under-bump-metal (UBM) layer 111 is further formed between the second redistribution layer 110 and the solder balls 106. The second redistribution layer 110 may have a structure same as that of the first redistribution layer 109. A method for forming the solder balls 106 comprises a ball planting process or a reflow soldering process. The UBM layer 111 may comprise a plurality of metal material layers. The UBM layer can provide desirable electrical connection between the solder balls and the chips, and has a desirable soldering effect in the reflow soldering process, thereby enhancing the reliability of the chip packaging structure.

Figure 8:
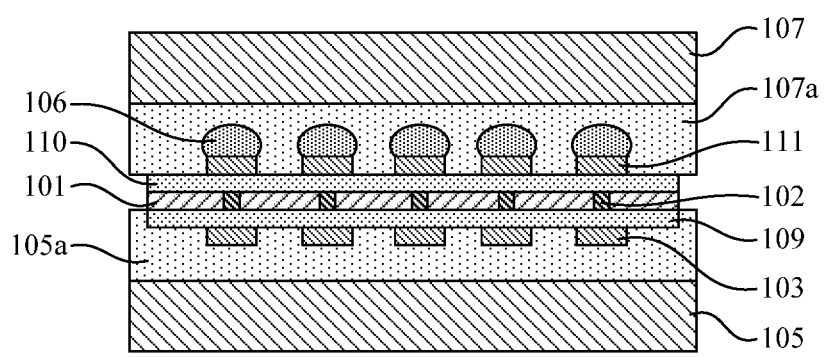
FIG. 8 is a schematic cross-sectional view of Embodiment I of the present disclosure after a second surface of the wafer is bonded to a second supporting substrate by means of a second bonding layer.
Figure 9:
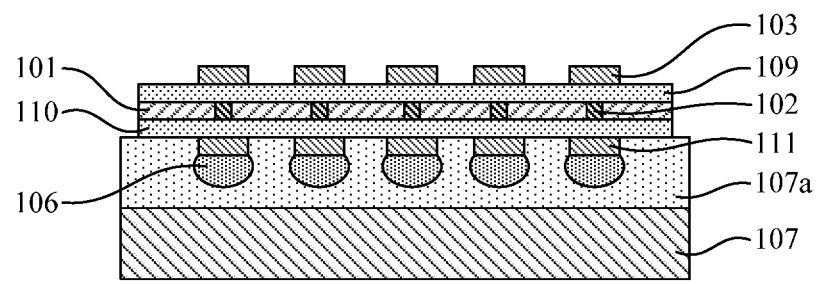
FIG. 9 is a schematic cross-sectional view of Embodiment I of the present disclosure after a first supporting substrate is peeled off.

In step 6), referring to S6 in FIG. 1 and FIG. 8 to FIG. 9, the second surface of the wafer 101 is bonded to the second supporting substrate 107, and the first supporting substrate 105 is peeled off.

As an example, as shown in FIG. 8, the second surface of the wafer 101 is bonded to the second supporting substrate 107 by means of a second bonding layer 107a. Optionally, the second bonding layer 107a may be formed by the same material as the first bonding layer 105a. The first supporting substrate 105 and the second supporting substrate 107 may be repeatedly used as temporarily bonded substrates, thereby reducing the production cost. Since the first supporting substrate 105 and the second supporting substrate 107 are introduced as the temporarily bonded substrates for protection, even if the chip packaging structure is substantially thinned, the thinned chip packaging structure will not be easily warped. Therefore, the chip packaging structure can be designed to be relatively thin, facilitating miniaturization of the chip packaging structure.

As an example, as shown in FIG. 9, the first supporting substrate 105 is peeled off. In FIG. 9, the first surface of the wafer 101 faces upward again. Optionally, a method for peeling off the first supporting substrate 105 comprises removing the first bonding layer 105a by a chemical solvent. For example, when the first bonding layer 105a comprise an organic bonding agent, a reagent, such as acetone may be used to dissolve the first bonding layer 105a, so as to peel off the first supporting substrate 105 from the wafer 101. When the first bonding layer 105a comprises other materials, an organic solvent, an acid etching solution, or an alkaline etching solution may be correspondingly used to remove the first bonding layer, as long as the other structures are not affected. In one embodiment, the first bonding layer 105a is removed by a chemical method, to peel off the temporarily bonded substrates. By means of the chemical method, complete removal of the temporarily bonded substrates can be achieved, the bonding agent is unlikely to remain, and the wafer yield can be significantly improved.

Figure 10:
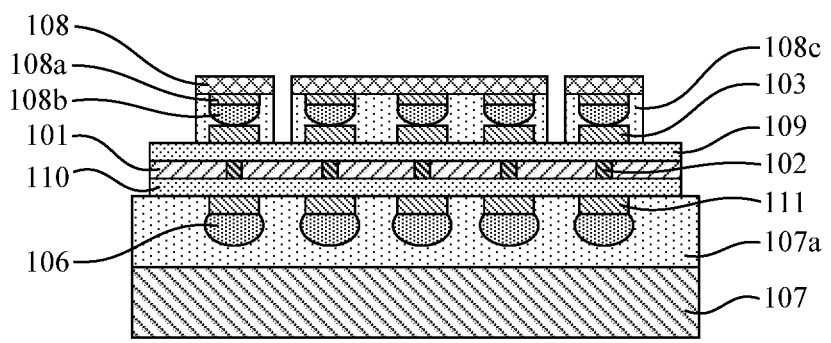
FIG. 10 is a schematic cross-sectional view of Embodiment I of the present disclosure after welding pads are connected to chips.

In step 7), referring to S7 in FIG. 1 and FIG. 10, each of the welding pads 103s is connected to a chip 108.

As an example, the chips 108 are connected to the welding pads 103 with the flip-chip bonding technique. Optionally, each of the chips 108 is connected to a corresponding welding pad 103 by means of a chip metal layer 108a and a chip solder ball 108b. An under chip filling layer 108c is further formed below each of the chips 108, to bolster the connection between the chip 108 and a corresponding welding pad 103.

Figure 11:
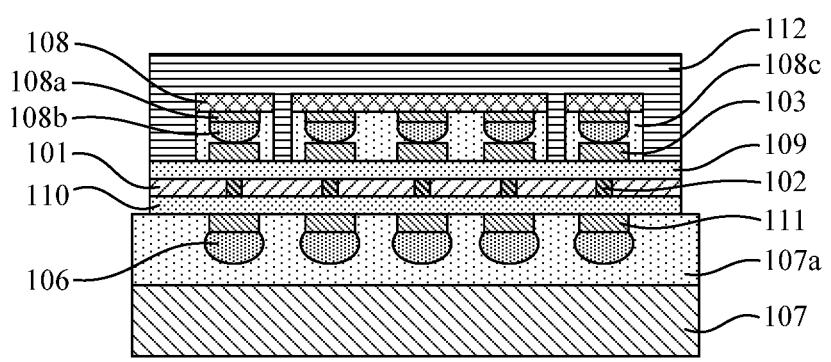
FIG. 11 is a schematic cross-sectional view Embodiment I of the present disclosure after sides of a first surface of the wafer are covered with a packaging layer.
Figure 12:
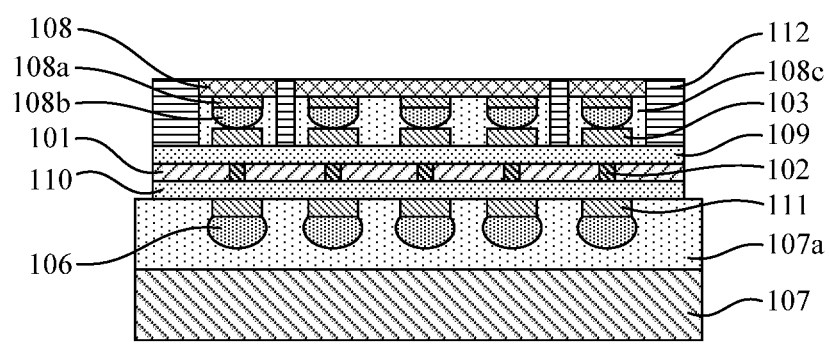
FIG. 12 is a schematic cross-sectional view of Embodiment I of the present disclosure after a packaging layer is partially removed by polishing.
Figure 13:
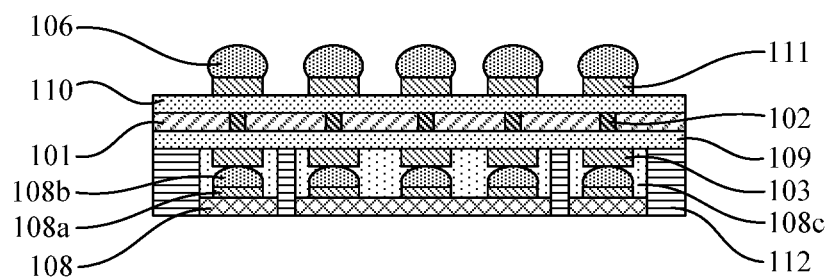
FIG. 13 is a schematic cross-sectional view of Embodiment I of the present disclosure after a second supporting substrate is peeled off.

As an example, as shown in FIG. 11 to FIG. 13, after the welding pads 103 are connected to the chips 108, the method further comprises a step of forming a packaging layer 112 on the second surface of the wafer 101 and peeling off the second supporting substrate 107.

As shown in FIG. 11, the packaging layer 112 is formed and covers the first surface of the wafer 101. A material of the packaging layer 112 comprises one of polyimide, silica gel, and epoxy resin. A method for forming the packaging layer 112 comprises one of compression molding, transfer molding, liquid sealing, vacuum lamination, and spin coating.

As shown in FIG. 12, the packaging layer 112 is partially removed by polishing to expose the upper surfaces of the chips 108.

As shown in FIG. 13, the second surface of the wafer 101 faces upward and the second supporting substrate 107 is peeled off. Optionally, a method for peeling off the second supporting substrate 107 is substantially the same as the method for peeling off the first supporting substrate 105.

In this embodiment, the trimming groove is introduced, reducing the stress generated by the thinning process and the risk of wafer fractures; the temporarily bonded first supporting substrate and second supporting substrate are introduced in the processes such as the thinning, effectively preventing abnormal warping of the wafer after the thinning, and enhancing the reliability of the processes; and the multi-layer chip packaging structure further effectively reduces the packaging size, and enhances the electrothermal performance and the communication performance of the packaging structure.

Embodiment II

As shown in FIG. 4, this embodiment provides a chip packaging structure. The chip packaging structure comprises:
a wafer 101, having a first surface and a second surface disposed opposite to each other;
TSVs 102, wherein the TSVs 102 are formed in the wafer 101 and each of the TSVs 102 has a first end exposed from the first surface of the wafer 101;
welding pads 103, formed on the first surface of the wafer 101 and connected to the TSVs 102; and
a trimming groove 104, formed in the first surface of the wafer 101 and located in an edge area of the wafer 101.

The chip packaging structure provided in this embodiment can effectively prevent wafer cracking caused by stress after thinning. As shown in FIG. 4, the trimming groove 104 may be formed by mechanical cutting and grinding, laser etching, dry etching, or the like. The trimming groove 104 may be on an outer peripheral edge of the wafer 101. By introducing the trimming groove 104, stress distribution on the wafer 101 during the thinning process can be more uniform. In this way, the wafer 101 is less likely to crack due to stress.

As an example, a first redistribution layer 109 is further formed between the TSVs 102 and the welding pads 103.

As an example, the depth of the trimming groove 104 is greater than the thickness of the thinned wafer 101.

Embodiment III

As shown in FIG. 13, this embodiment also provides a chip packaging structure. The chip packaging structure comprises:
a wafer 101, having a first surface and a second surface disposed opposite to each other;
a TSVs 102, formed in the wafer 101;
welding pads 103, formed on the first surface of the wafer 101 and connected to the TSVs 102; and
solder balls 106, formed on the second surface of the wafer 101 and connected to the TSVs 102.

This embodiment provides a multi-layer chip packaging structure with welding pads. The multi-layer chip packaging structure has a high overall package density, and can effectively reduce the size of the chip packaging structure. Optionally, a UBM layer 111 is further formed between the second redistribution layer 110 and the solder balls 106.

As an example, as shown in FIG. 13, a first redistribution layer 109 is further formed between the TSVs 102 and the welding pads 103. A second redistribution layer 110 is further formed between the TSVs 102 and the solder balls 103.

As an example, as shown in FIG. 13, the chip packaging structure further comprises one or more chips 108. The chips are connected to the welding pads 103. An under chip filling layer 108c is further formed for each of the one or more chips 108 and a corresponding welding pad 103, to bolster the connection thereof. The first surface of the wafer 101 is covered with a packaging layer 112.

In summary, the present disclosure provides a chip packaging structure and a method for preparing the same. The method comprises the following steps: providing a wafer having a first surface and a second surface disposed opposite to each other, wherein TSVs are formed in the wafer and TSVs' first ends are exposed from the first surface; forming, on the first surface of the wafer, welding pads connected to the TSVs; forming a trimming groove in the first surface of the wafer, wherein the trimming groove is located in an edge area of the wafer; bonding the first surface of the wafer to a first supporting substrate, and thinning the second surface of the wafer to expose the TSV; forming, on the second surface of the wafer, solder balls connected to the TSV; bonding the second surface of the wafer to a second supporting substrate, and peeling off the first supporting substrate; and connecting chips to the welding pads. According to the present disclosure, the trimming groove is introduced in the to-be-thinned wafer, reducing the stress generated by the thinning process and the risk of wafer fractures; the temporarily bonded first supporting substrate and second supporting substrate are introduced in the processes such as the thinning, effectively preventing abnormal warping of the wafer after thinning, and enhancing the reliability of the process; and the multi-layer chip structure further effectively reduces the packaging size, and enhances the electrothermal performance and the communication performance of the packaging structure.

The above embodiments merely exemplarily describe the principles and effects of the present disclosure, and are not intended to limit the present disclosure. Any person familiar with this technology all may make modifications or variations to the above embodiments without departing from the spirit and scope of the present disclosure. Therefore, all equivalent modifications or changes completed by a person of ordinary skill in the art without departing from the spirit and technical ideas disclosed in the present disclosure, shall still fall within the scope of the claims of the present disclosure.

What is claimed is:

1. A method for preparing a chip packaging structure, comprising:
providing a wafer having a first surface and a second surface opposite to each other, wherein through-silicone vias (TSVs) are formed in the wafer, and thinning the wafer on the first surface to expose first ends of the TSVs;

forming, on the first surface of the wafer, welding pads electrically connected to the TSVs;

forming a trimming groove on the first surface of the wafer, wherein the trimming groove is located in an edge area of the wafer, wherein a depth of the trimming groove is greater than a thickness of the thinned wafer;

bonding the first surface of the wafer to a first supporting substrate;

thinning the second surface of the wafer, wherein the thinning stops when reaching the trimming groove at the edge area of the wafer, wherein the thinning exposes second ends of the TSVs;

forming, on the second surface of the wafer, solder balls electrically connected to the TSVs;

bonding the second surface of the wafer to a second supporting substrate, and peeling off the first supporting substrate; and connecting chips to the welding pads.

2. The method for preparing the chip packaging structure as in claim 1, wherein a first redistribution layer is further formed between the TSVs and the welding pads and electrically connects the TSVs to the welding pads, and a second redistribution layer is further formed between the TSVs and the solder balls and electrically connects the TSVs to the welding pads.

3. The method for preparing the chip packaging structure as in claim 2, wherein an under-bump-metal (UBM) layer is further formed between the second redistribution layer and the solder balls.

4. The method for preparing the chip packaging structure as in claim 1, wherein a depth of the trimming groove is greater than a thickness of the thinned wafer.

5. The method for preparing the chip packaging structure as in claim 1, wherein the welding pads are connected to the chips by a flip-chip bonding technique.

6. The method for preparing the chip packaging structure as in claim 1, wherein after the welding pads are connected to the chips, the method further comprises a step of forming a packaging layer on the first surface of the wafer and peeling off the second supporting substrate.

7. The method for preparing the chip packaging structure as in claim 6, wherein the first supporting substrate and the second supporting substrate are bonded to the wafer by a first bonding layer and a second bonding layer respectively, and wherein peeling off the first supporting substrate and the second supporting substrate comprises removing the first bonding layer and the second respectively the bonding layer by using a chemical solvent.

\* \* \* \* \*